United States Patent [19]
Takahashi

[11] Patent Number: 5,812,420
[45] Date of Patent: Sep. 22, 1998

[54] VIBRATION-PREVENTIVE APPARATUS AND EXPOSURE APPARATUS

[75] Inventor: Masato Takahashi, Yokohama-shi, Japan

[73] Assignee: Nikon Corporation, Tokyo, Japan

[21] Appl. No.: 707,216

[22] Filed: Sep. 3, 1996

[30] Foreign Application Priority Data

Sep. 5, 1995 [JP] Japan .................................... 7-251887
Sep. 5, 1995 [JP] Japan .................................... 7-251888

[51] Int. Cl.$^6$ ............................ G03B 27/42; F16M 13/00
[52] U.S. Cl. ......................... 364/508; 248/550; 248/638; 73/662
[58] Field of Search ..................... 248/548, 550, 248/562, 563, 565, 566, 557, 636, 638; 356/400, 401; 355/53, 54, 30, 43; 378/34, 35; 364/508; 73/662, 663, 664, 665

[56] References Cited

U.S. PATENT DOCUMENTS

| | | | |
|---|---|---|---|
| 5,060,519 | 10/1991 | Chojitani et al. | 73/662 |
| 5,121,898 | 6/1992 | Yasuda et al. | 248/550 |
| 5,172,160 | 12/1992 | Van Eijk et al. | 355/53 |
| 5,187,519 | 2/1993 | Takabayashi et al. | 355/53 |
| 5,467,720 | 11/1995 | Korenaga et al. | 248/566 |
| 5,473,424 | 12/1995 | Okumura | 356/400 |
| 5,478,043 | 12/1995 | Wakui | 248/500 |
| 5,502,311 | 3/1996 | Imai et al. | 250/548 |
| 5,502,313 | 3/1996 | Nakamura et al. | 250/548 |
| 5,539,497 | 7/1996 | Nishi | 355/53 |
| 5,579,084 | 11/1996 | Takahashi et al. | 355/53 |

*Primary Examiner*—Hezron E. Williams
*Assistant Examiner*—Rose M. Miller
*Attorney, Agent, or Firm*—Oliff & Berridge, PLC

[57] ABSTRACT

A position of movement of a stage is measured by an interferometer when the stage placed on a vibration-preventive pedestal of an exposure apparatus is moved. An output of the interferometer is multiplied by K so as to correct an amount of inclination of the vibration-preventive pedestal caused by movement of a position of a center of gravity during the movement of the stage, and an obtained value is feedforward-inputted into a vibration control system of a control unit. The vibration control system controls actuators on the basis of outputs of a displacement sensor and a vibration sensor and the feedforward-inputted value so that vibration of the vibration-preventive pedestal is suppressed. A vibration-compensating system multiplies, by g, displacements $\theta_x$, $\theta_y$ in a direction of inclination with respect to a horizontal plane obtained on the basis of outputs of three vertical displacement sensors. Obtained results are subtracted from outputs of horizontal acceleration sensors. Thus gravitational acceleration components can be removed from the outputs of the horizontal sensors. The suppressing effect on disturbance vibration can be improved without being affected by the movement of the position of the center of gravity of the main apparatus body associated with the movement of the stage.

25 Claims, 5 Drawing Sheets

VIBRATION-PREVENTIVE APPARATUS AND EXPOSURE APPARATUS

BACKGROUND OF THE INVENTION

1. Field of the Invention

The present invention relates to a vibration-preventive apparatus and an exposure apparatus. In particular, the present invention relates to a vibration-preventive apparatus of the so-called active system in which a vibration-preventive pedestal is driven by actuators so that vibration of the vibration-preventive pedestal is counteracted, and an exposure apparatus provided with the vibration-preventive apparatus.

2. Description of the Related Art

Precision mechanical equipment such as a reduction projection type exposure apparatus of the step-and-repeat system, i.e., a so-called stepper is developed to have high accuracy. As a result, it becomes necessary to insulate microvibration acting from an installation floor to a platform (vibration-preventive pedestal) at a micro G level. A vibration-preventive pad for supporting the vibration-preventive pedestal of a vibration-preventive apparatus includes various ones such as a pneumatic damper and a mechanical damper comprising a compressive coil spring inserted in a damping liquid. The vibration-preventive pad itself has a centering function to some extent. Especially, an air spring type vibration-preventive apparatus provided with a pneumatic damper has a spring constant which can be set to be small, and hence it insulates vibration of about 10 Hz or more. Accordingly, the vibration-preventive apparatus of this type is widely used for supporting precision mechanical equipment. Recently, in order to break through the limit of the conventional passive vibration-preventive apparatus, an active vibration-preventive apparatus has been proposed (for example, see U.S. patent application Ser. No. 539080 filed by the same applicant as that of this application). The active vibration-preventive apparatus performs vibration control by detecting vibration of a vibration-preventive pedestal with a sensor, and driving an actuator on the basis of an output of the sensor. The active vibration-preventive apparatus can provide an ideal vibration-insulating effect with no resonance peak in a low frequency control zone.

As for the stepper, an XY stage (wafer stage), which undergoes large acceleration and deceleration, is carried on a platform supported by vibration-preventive pads, and the position of the center of gravity of a main exposure apparatus body moves simultaneously with movement of the XY stage. When the position of the center of gravity of the main apparatus body is changed in accordance with the movement of the stage, the active vibration-preventive apparatus makes positioning at an initial position by the aid of a position control loop. Increase in the amount of movement of the stage involves increase in the amount of change in the position of the center of gravity of the main apparatus body, resulting in inclination of the main apparatus body. In such a situation, the conventional active vibration-preventive apparatus can enjoy improvement in response characteristics of position control by increasing the gain of the position control loop. However, increase in the gain of the position control loop allows floor vibration to be transmitted to the main apparatus body, resulting in deterioration of vibration-preventive performance. Accordingly, increase in the gain of the position control loop has a limit, and involves, for example, a fear for occurrence of an inconvenience that the balance of force between the main apparatus body and the actuator is destroyed, and the main apparatus body is deviated from the initial position, due to consequent movement of the position of the center of gravity of the main apparatus body.

The stepper suffers swinging of its platform at a large amplitude caused by a disturbance force during, for example, quick acceleration and quick deceleration of an XY stage. The active vibration-preventive apparatus often uses an acceleration sensor as a vibration sensor. Especially, in the case of an exposure apparatus, horizontal acceleration sensors for detecting accelerations in X and Y two-dimensional directions in a horizontal plane are sometimes arranged on a platform held horizontally on vibration-preventive pads. In such an arrangement, when the vibration-preventive pedestal is swung at a large amplitude and inclined, the horizontal acceleration sensor inevitably detects a component of the gravitational acceleration in proportion to an amount of inclination of the platform, together with an acceleration of its original detecting direction. It is desirable to suppress the component of the gravitational acceleration to be as small as possible because the component badly affects a vibration control loop. However, it is impossible to find a conventional active vibration-preventive apparatus which is so far directed to the component of the gravitational acceleration.

SUMMARY OF THE INVENTION

An object of the present invention is to provide a vibration-preventive apparatus and an exposure apparatus provided therewith which make it possible to dissolve the inconvenience involved in the conventional art and improve the suppressing (vibration-damping) effect on disturbance vibration without being affected by the movement of the position of the center of gravity of the main apparatus body caused by the movement of the stage. Another object of the present invention is to provide a vibration-preventive apparatus and an exposure apparatus provided therewith which make it possible to improve the suppressing (vibration-damping) effect on disturbance vibration without being affected by the inclination of the vibration-preventive pedestal.

According to a first aspect of the present invention, there is provided a vibration-preventive apparatus comprising:
- a vibration-preventive pedestal held horizontally through at least three vibration-preventive pads;
- at least one stage movable on the vibration-preventive pedestal;
- at least three actuators for moving the vibration-preventive pedestal in a vertical direction;
- at least one displacement sensor for detecting displacement of the vibration-preventive pedestal;
- at least one vibration sensor for detecting vibration of the vibration-preventive pedestal;
- a vibration control system for controlling the respective actuators on the basis of outputs of the displacement sensor and the vibration sensor so that the vibration of the vibration-preventive pedestal is suppressed;
- a position-measuring unit for measuring a position of the at least one stage; and
- a vibration-compensating system for forecasting an amount of inclination of the vibration-preventive pedestal caused by movement of a position of a center of gravity during movement of the stage on the basis of an output of the position-measuring unit, and inputting a command value to correct the amount of inclination into the vibration control system in a feedforward manner.

When the stage is moved in the vibration-preventive apparatus of the present invention, the position of movement of the stage is measured by the position-measuring unit. The vibration-compensating system forecasts the amount of inclination of the vibration-preventive pedestal caused by movement of the position of the center of gravity during movement of the stage on the basis of the output of the position-measuring unit, and inputs the command value to correct the amount of inclination into the vibration control system in a feedforward manner. The vibration control system drives and controls the respective actuators on the basis of the outputs of the displacement sensor and the vibration sensor and the feedforward-inputted command value so that the vibration of the vibration-preventive pedestal is suppressed. Thus the amount of inclination of the vibration-preventive pedestal caused by the movement of the position of the center of gravity during the movement of the stage is corrected together with the vibration of the vibration-preventive pedestal. In this arrangement, it is unnecessary to excessively increase the gain of the vibration control system. Accordingly, the vibration-preventive performance is not deteriorated as well. Therefore, it is possible to improve the suppressing (vibration-damping) effect on disturbance vibration without being affected by the movement of the position of the center of gravity of the main apparatus body involved in the movement of the stage.

The vibration-preventive apparatus described above may further comprise a scan counter for feedforward-inputting, into the vibration control system, command values for reaction forces having directions opposite to those of accelerations immediately after start and immediately before stop of the movement of the stage. The scan counter serves to feedforward-input, into the vibration control system, the command values for the reaction forces having the directions opposite to those of the accelerations immediately after start and immediately before stop of the movement of the stage. Accordingly, the vibration control system drives and controls the actuators so as to suppress vibrations generated on the vibration-preventive pedestal immediately after start and immediately before stop of the movement of the stage. Therefore, the vibration-damping effect can be further improved.

According to a second aspect of the present invention, there is provided an exposure apparatus for transferring a pattern formed on a mask onto a photosensitive substrate through a projection optical system, comprising:

a vibration-preventive pedestal held horizontally through at least three vibration-preventive pads;

a substrate stage, movable on the vibration-preventive pedestal, for holding the photosensitive substrate;

at least three actuators for moving the vibration-preventive pedestal in a vertical direction;

at least one displacement sensor for detecting displacement of the vibration-preventive pedestal;

at least one vibration sensor for detecting vibration of the vibration-preventive pedestal;

a vibration control system for controlling the respective actuators on the basis of outputs of the displacement sensor and the vibration sensor so that the vibration of the vibration-preventive pedestal is suppressed;

a position-measuring unit for measuring a position of the substrate stage; and a vibration-compensating system for forecasting an amount of inclination of the vibration-preventive pedestal caused by movement of a position of a center of gravity during movement of the substrate stage on the basis of an output of the position-measuring unit, and inputting a command value to correct the amount of inclination into the vibration control system in a feedforward manner. The exposure apparatus of the present invention is provided with the vibration-preventive apparatus excellent in the vibration-damping effect. Accordingly, the exposure apparatus can transfer a mask pattern onto a photosensitive substrate accurately and precisely. Especially, the exposure apparatus of the present invention is preferably used as a scanning type exposure apparatus in which a mask stage and a photosensitive substrate move synchronously in the scanning direction.

According to a third aspect of the present invention, there is provided a vibration-preventive apparatus comprising:

a vibration-preventive pedestal held horizontally through at least three vibration-preventive pads;

at least three actuators for driving the vibration-preventive pedestal in a vertical direction at different positions;

at least three vertical displacement sensors for detecting vertical displacement of the vibration-preventive pedestal at different points;

a vibration sensor for detecting at least an acceleration of the vibration-preventive pedestal in a horizontal plane;

a vibration control system for controlling the respective actuators on the basis of outputs of the displacement sensors and the vibration sensor so that vibration of the vibration-preventive pedestal is suppressed; and a vibration-compensating system for removing a gravitational acceleration component contained in a detected value obtained by the vibration sensor on the basis of displacement in a direction of inclination with respect to the horizontal plane obtained on the basis of the outputs of the three vertical displacement sensors.

According to the vibration-preventive apparatus described above, when the vibration-preventive pedestal swings, the vibration control system drives and controls the respective actuators on the basis of the outputs of the displacement sensors and the vibration sensor so that the vibration of the vibration-preventive pedestal is suppressed. In this arrangement, the vibration-compensating system removes the gravitational acceleration component contained in the detected value obtained by respective horizontal acceleration sensors (vibration sensor) on the basis of the displacement in the direction of inclination with respect to the horizontal plane obtained on the basis of the outputs of the three vertical displacement sensors. Therefore, the vibration control system drives and controls the respective actuators on the basis of the output of the horizontal acceleration sensors from which the gravitational acceleration component has been removed. Accordingly, the suppressing (vibration-damping) effect on disturbance vibration is improved without being affected by the inclination of the vibration-preventive pedestal.

According to a fourth aspect of the present invention, there is provided an exposure apparatus for transferring a pattern formed on a mask onto a photosensitive substrate through a projection optical system, comprising:

a vibration-preventive pedestal held horizontally through at least three vibration-preventive pads;

at least one stage, movable on the vibration-preventive pedestal, for holding the photosensitive substrate;

at least three actuators for driving the vibration-preventive pedestal in a vertical direction at different positions;

at least three vertical displacement sensors for detecting vertical displacement of the vibration-preventive pedestal at different points;

a vibration sensor for detecting at least an acceleration of the vibration-preventive pedestal in a horizontal plane;

a vibration control system for controlling the respective actuators on the basis of outputs of the displacement sensors and the vibration sensor so that vibration of the vibration-preventive pedestal is suppressed; and a vibration-compensating system for removing a gravitational acceleration component contained in a detected value obtained by the vibration sensor on the basis of displacement in a direction of inclination with respect to the horizontal plane obtained on the basis of the outputs of the three vertical displacement sensors. The aforementioned exposure apparatus is provided with the vibration-preventive apparatus excellent in the vibration-damping effect. Accordingly, the exposure apparatus can transfer a mask pattern onto a photosensitive substrate accurately and precisely.

Preferably, the vibration-compensating system of the vibration-preventive apparatus according to the third aspect and the exposure apparatus according to the fourth aspect further comprises a function for forecasting an amount of inclination of the vibration-preventive pedestal caused by movement of a position of a center of gravity during movement of the stage on the basis of an output of a stage position-measuring unit, and inputting a command value to correct the amount of inclination into the vibration control system in a feedforward manner.

DETAILED DESCRIPTION OF PREFERRED EMBODIMENTS

Figure 1:
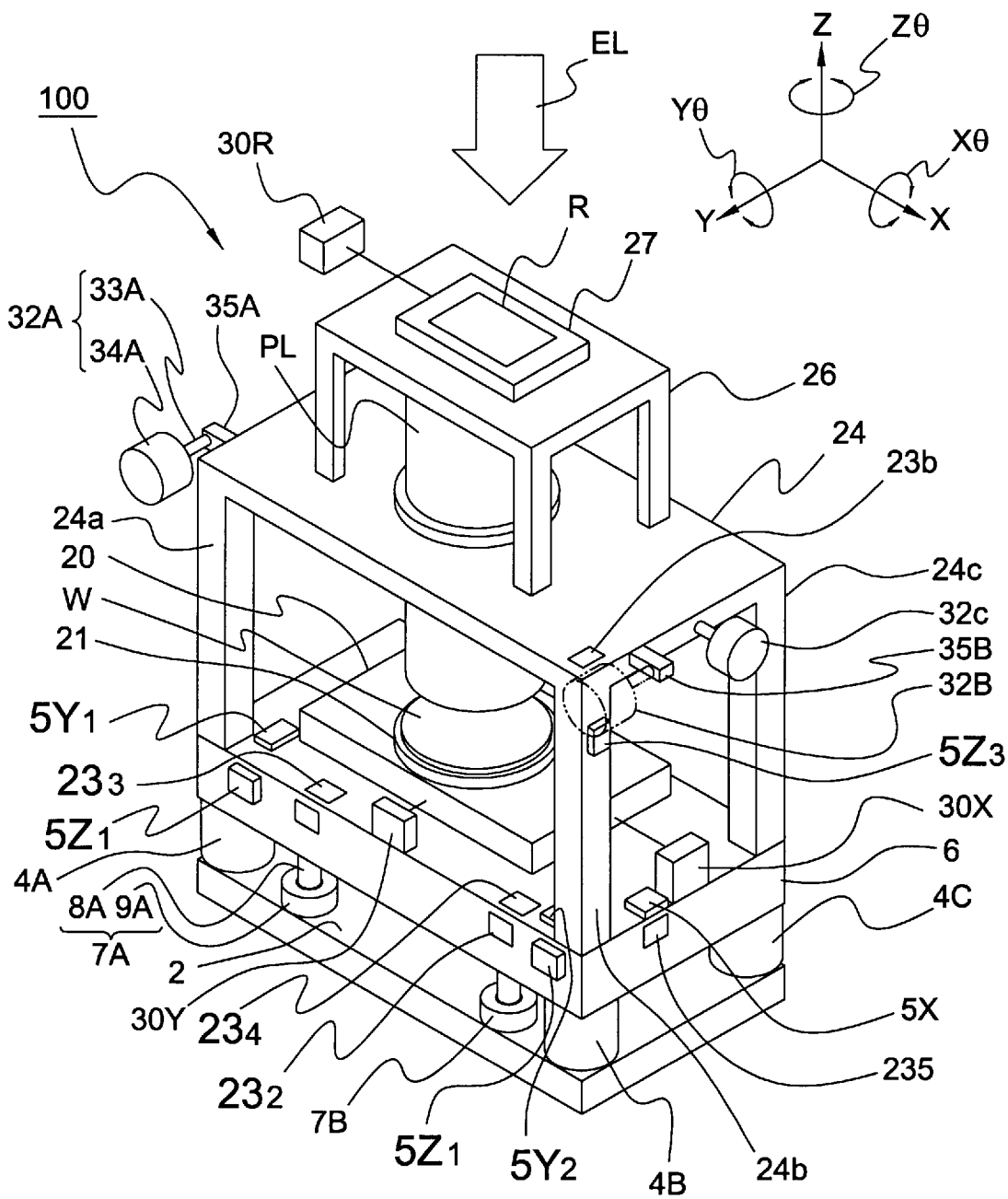
FIG. 1 shows a perspective view illustrating a projection exposure apparatus according to an embodiment of the present invention.

An embodiment of the present invention will be explained below with reference to the drawings. FIG. 1 shows a schematic perspective view of a step-and-scan type exposure apparatus 100 according to an embodiment of the exposure apparatus of the present invention. In FIG. 1, an oblong plate-shaped base 2 is installed on a floor as an installation plane. Vibration-preventive pads 4A to 4D (a vibration-preventive pad 4D located on a backward side on the plane of paper is not illustrated in FIG. 1) are installed on the base 2. A platform 6 having an oblong shape to serve as a vibration-preventive pedestal is installed on the vibration-preventive pads 4A to 4D. In this embodiment, a projection optical system PL is used as described later on. Accordingly, a Z axis is defined in parallel to an optical axis of the projection optical system PL, an X axis is defined in a longitudinal direction of the platform 6 in a plane perpendicular to the Z axis, and a Y axis is defined in a direction perpendicular thereto. Directions of rotation about the respective axes are defined as Zθ, Xθ, and Yθ directions. In the following explanation, the direction will be referred to in a classified manner such that directions indicated by respective arrows representing the X, Y, and Z axes in FIG. 1 are referred to as +X, +Y, and +Z directions, and directions opposite thereto are referred to as −X, −Y, and −Z directions, if necessary.

The vibration-preventive pads 4A to 4D are arranged at positions near to four vertexes of an oblong bottom surface of the platform 6 respectively. In this embodiment, pneumatic dampers are used as the vibration-preventive pads 4A to 4D, with which the heights of the vibration-preventive pads 4A to 4D can be adjusted by using pneumatic pressure. Accordingly, the pneumatic dampers also serve as vertical movement mechanisms. Another vertical movement mechanisms may be separately provided so that, for example, mechanical dampers each comprising a compressive coil spring introduced into a damping liquid may be used as vibration-preventive pads.

An actuator 7A is installed in parallel to the vibration-preventive pad 4A between the base 2 and the platform 6. The actuator 7A comprises a stator 9A fixed on the base 2 and a movable element 8A fixed on the bottom surface of the platform 6. The actuator 7A generates an urging force in the Z direction exerted on the bottom surface of the platform 6 from the base 2, or an attracting force directed from the bottom surface of the platform 6 to the base 2 in accordance with an instruction from a control unit 11 (not shown in FIG. 1, see FIGS. 3 and 4). As for the other vibration-preventive pads 4B to 4D, actuators 7B to 7D are installed in parallel respectively in the same manner as the vibration-preventive pad 4A (provided that the actuators 7C, 7D located on the backward side on the plane of paper are not illustrated in FIG. 1), and urging forces and attracting forces of the actuators 7B to 7D are similarly set by the control unit 11 (not shown in FIG. 1, see FIGS. 3 and 4) respectively. A method for controlling the actuators 7A to 7D will be described later on.

Figure 2A:
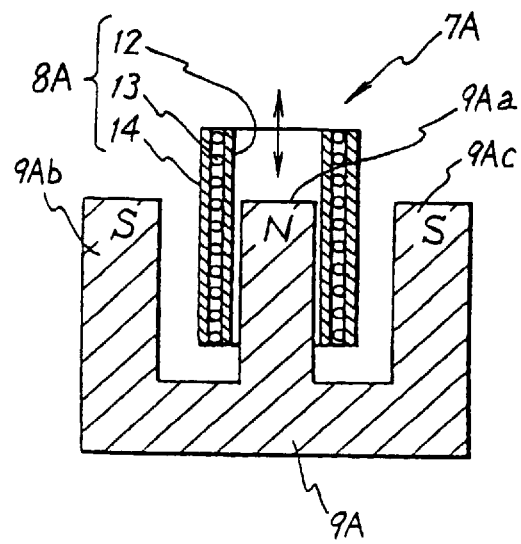
FIG. 2A shows an enlarged cross-sectional view illustrating an example of an actuator 7A.

Next, a detailed arrangement of the actuator 7A will be explained with reference to FIGS. 2A and 2B. FIG. 2A shows an example of the arrangement of the actuator 7A. In FIG. 2A, the stator 9A is composed of a magnetic material comprising shafts 9Ab, 9Ac to serve as the south pole formed on both sides of a shaft 9Aa to serve as the north pole. The movable element 8A comprises an inner cylinder 12 loosely fitted to the shaft 9A, a coil 13 wound around an outer surface of the inner cylinder 12, and an outer cylinder 14 for covering the coil 13. A force in a direction parallel to the shaft 9Aa (±Z direction) is generated between the stator 9A and the movable element 8A by adjusting a current flowing through the coil 13.

Figure 2B:
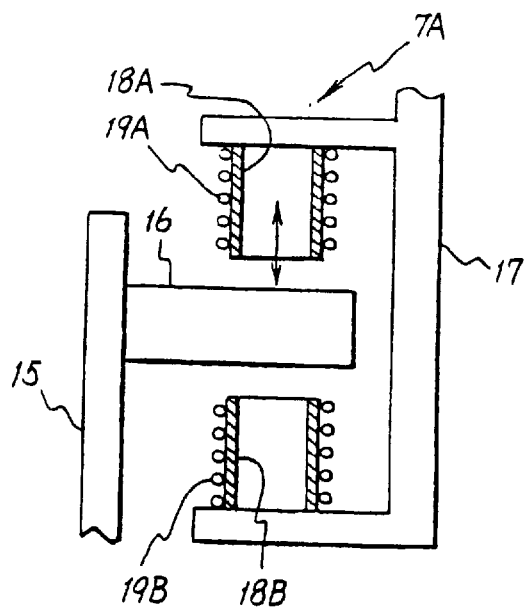
FIG. 2B shows an enlarged cross-sectional view illustrating another example of the actuator 7A.

FIG. 2B shows another example of the actuator 7A. In FIG. 2B, a stator 16 made of a magnetic material is fixed to a first member 15. Inner cylinders 18A, 18B are fixed to a second member 17 so that the stator 16 is interposed therebetween. Coils 19A, 19B are wound around outer surfaces of the inner cylinders 18A, 18B respectively. Also in this arrangement, the balance of attracting force between the first and second members 15, 17 is changed to generate a force by adjusting currents flowing through the coils 19A, 19B. The other actuators 7B to 7D are constructed in the same manner as the actuator 7A as well.

With reference to FIG. 1 again, acceleration sensors $5Z_1$, $5Z_2$, which serve as vibration sensors for detecting accelerations of the platform 6 in the Z direction, are attached to a side surface located in the +Y direction of the platform 6. Acceleration sensors $5Y_1$, $5Y_2$, which serve as vibration sensors for detecting accelerations of the platform 6 in the Y direction, are attached at end positions located in the +Y direction of the upper surface of the platform 6. An acceleration sensor 5X, which serves as a vibration sensor for detecting an acceleration of the platform 6 in the X direction, is attached at an end position located in the +X direction of the upper surface of the platform 6. Those usable as the acceleration sensors $5Z_1$, $5Z_2$, $5Y_1$, $5Y_2$, 5X include, for example, piezoresistance effect type acceleration sensors and semiconductor type acceleration sensors. Outputs of the acceleration sensors $5Z_1$, $5Z_2$, $5Y_1$, $5Y_2$, 5X are also supplied to the control unit 11 (not shown in FIG. 1, see FIGS. 3 and 4).

Rectangular metal plates (conductive material) $23_1$, $23_2$ having a predetermined area are stuck on the side surface located in the +Y direction of the platform 6. In this embodiment, a platform made of ceramic which is a non-conductive material is used as the platform 6. Displacement sensors $10Y_1$, $10Y_2$ (not shown in FIG. 1 to avoid graphical complication, see FIGS. 3 and 4) for detecting displacement of the platform in the Y direction are provided outside the platform 6 at positions opposing to surfaces of the metal plates $23_1$, $23_2$. For example, eddy current displacement sensors are used as the displacement sensors $10Y_1$, $10Y_2$. The eddy current displacement sensor is operated as follows. When an AC voltage is previously applied to a coil wound around an insulator, and the coil is allowed to approach a measurement objective comprising a conductive material (conductor), then an eddy current is generated in the conductor by an AC magnetic field produced by the coil. A magnetic field generated by the eddy current has a direction opposite to that of the magnetic field produced by the current of the coil. The two magnetic fields are superimposed with each other, and they affect the output of the coil. Thus the intensity and the phase of the current flowing through the coil change. The change is large when the objective is nearer to the coil, while the change is small when the objective is farther from the coil. Accordingly, it is possible to know the position and the displacement of the objective by taking a signal out of the coil. Alternatively, a non-contact displacement sensor of the electrostatic capacity type may be used as the displacement sensor. The non-contact displacement sensor of the electrostatic capacity type detects the distance between the sensor and a measurement objective in a non-contact manner by utilizing the fact that the electrostatic capacity is inversely proportional to the distance between an electrode of the sensor and the measurement objective. Further alternatively, PSD (photo semiconductor position detector) may be used as the displacement sensor provided that a constructed system can exclude the influence of background light.

Metal plates $23_3$, $23_4$ having a predetermined area are stuck at end positions located in the +Y direction of the upper surface of the platform 6. Displacement sensors $10Z_1$, $10Z_2$ (not shown in FIG. 1, see FIGS. 3 and 4) composed of eddy current displacement sensors for detecting displacement of the platform 6 in the Z direction are provided over the platform 6 at positions opposing to the metal plates $23_3$, $23_4$. Further, a metal plate $23_5$ having a predetermined area is stuck on a side surface located in the +X direction of the platform 6. A displacement sensor 10X (not shown in FIG. 1, see FIG. 3) composed of an eddy current displacement sensor for detecting displacement of the platform 6 in the X direction is provided at a position opposing to the metal plate $23_5$. Outputs of the displacement sensors $10Y_1$, $10Y_2$, $10Z_1$, $10Z_2$, 10X are also supplied to the control unit 11 (not shown in FIG. 1, see FIGS. 3 and 4).

An XY stage 20 is placed on the platform 6, which serves as a substrate stage to be driven in the X and Y two dimensional directions by an unillustrated driving means. A Z leveling stage and a θ stage (both are not shown) are placed on the XY stage 20, and a wafer W as a photosensitive substrate is attracted and held thereon through a wafer holder 21. A first column 24 is mounted on the platform 6 so that it surrounds the XY stage 20. A projection optical system PL is fixed at a central portion of an upper plate of the first column 24. A second column 26 is mounted on the upper plate of the first column 24 so that it surrounds the projection optical system PL. A reticle R as a mask is placed on a central portion of an upper plate of the second column 26 through a reticle stage 27.

The movement position of the XY stage 20 in the Y direction is measured by a laser interferometer 30Y for the Y axis as a position-measuring unit. The movement position of the XY stage 20 in the X direction is measured by a laser interferometer 30X for the X axis as a position-measuring unit. Outputs of the laser interferometers 30Y, 30X are inputted into the control unit 11 (see FIG. 3) and an unillustrated main control unit. The Z leveling stage is constructed such that the driving in the Z axis direction and the inclination with respect to the Z axis are adjustable. The θ stage is constructed such that it is finely rotatable about the Z axis. Therefore, the wafer W can be positioned three-dimensionally by using the XY stage 20, the Z leveling stage, and the θ stage.

The reticle stage 27 is constructed such that the reticle R is finely adjustable in the Y axis direction, and the angle of rotation is adjustable. The reticle stage 27 is driven in the X direction by an unillustrated driving means. The position of the reticle stage 27 in the X direction is measured by a reticle laser interferometer 30R as a position-measuring unit. An output of the reticle laser interferometer 30R is also inputted into the control unit 11 (see FIG. 3) and the unillustrated main control unit.

An unillustrated illumination optical system is arranged over the reticle R. The unillustrated main control unit conducts relative positional adjustment (alignment) for the reticle R and the wafer W, and it conducts autofocusing by using an unillustrated focus-detecting system, while each of shot areas on the wafer W is successively exposed with an image of a pattern formed on the reticle R through the projection optical system PL under an illumination light beam EL for exposure radiated from the illumination optical system. In this embodiment, when each of the shot areas is exposed, the main control unit allows the XY stage 20 and the reticle stage 27 to be relatively scanned at a predetermined velocity ratio along the X axis direction (scanning direction) by the aid of respective driving means.

The first column 24 has four legs 24a to 24d (leg 24d located on the backward side on the plane of paper is not shown in FIG. 1) which contact with the platform 6. An acceleration sensor $5Z_3$ for detecting an acceleration of the first column 24 in the Z direction is attached to a side surface located in the +X direction of the leg 24b. For example, a semiconductor acceleration sensor of the piezoresistance effect type or the electrostatic capacity type is used as the acceleration sensor $5Z_3$. An output of the acceleration sensor $5Z_3$ is also inputted into the control unit 11 (not shown in FIG. 1, see FIG. 3). A metal plate $23_6$ having a predetermined area is stuck on the upper surface of the upper plate of the first column 24 at a corner which is located at an end position in the +Y direction and an end position in the +X direction. A displacement sensor $10Z_3$ (not shown in FIG. 1, see FIG. 3) composed of an eddy current displacement sensor for detecting displacement of the first column 24 in the Z direction is provided at a position opposing to the metal plate $23_6$.

A movable shaft 35A is embedded in a side surface located in the −X direction of the first column 24. An actuator 32A is attached between the movable shaft 35A and an unillustrated support column fixed on the floor. The actuator 32A comprises a stator 34A composed of a magnetic material fixed to the unillustrated support column, and a movable element 33A including a coil attached to the movable shaft 35A, in the same manner as the actuator 7A. A force can be exerted in the ±Y directions on the movable shaft 35A by adjusting the current flowing through the coil in the movable element 33A by the aid of the control unit 11. Similarly, a movable shaft 35B is embedded in the side surface located in the +X direction of the first column 24. An actuator 32B having the same structure as that of the actuator 32A is attached between the movable shaft 35B and an unillustrated support column fixed on the floor. A force can be exerted in the ±Y directions on the movable shaft 35B in accordance with an instruction from the control unit 11. An actuator 32C having the same structure as that of the actuator 32A is installed between an unillustrated support column fixed on the floor and a central portion of the side surface located in the +X direction of the first column 24. A force can be exerted in the ±X directions on the first column 24 through the actuator 32C in accordance with an instruction from the control unit 11. A method for controlling the actuators 32A to 32C by using the control unit 11 will be also described later on.

Now adjustment for the height and the horizontal level of the platform 6 upon installation of the exposure apparatus 100 will be briefly explained. Displacement in the Z direction (height) of the platform 6 measured by the displacement sensors $10Z_1$, $10Z_2$, $10Z_3$ is transmitted to an unillustrated control system for the vibration-preventive pads 4A to 4D. On the basis of transmitted data, the control system for the vibration-preventive pads 4A to 4D adjusts the height of the platform 6 to be a previously set value, and it calculates heights of the respective vibration-preventive pads 4A to 4D to maintain the horizontal level. After that, the control system sets the heights of the vibration-preventive pads 4A to 4D to be the respective calculated heights. After that, the heights of the vibration-preventive pads 4A to 4D are maintained at the respective set values. Accordingly, no distortion occurs in the platform 6, and for example, the positioning accuracy for the XY stage 20 on the platform 6 is maintained highly accurately.

In this embodiment, a main apparatus body 40 (main exposure apparatus body) (see FIG. 3) of the exposure apparatus is principally constructed by the platform 6, the XY stage 20, the wafer holder 21, the first column 24, the projection optical system PL, the second column 26, and the reticle stage 27.

Figure 3:
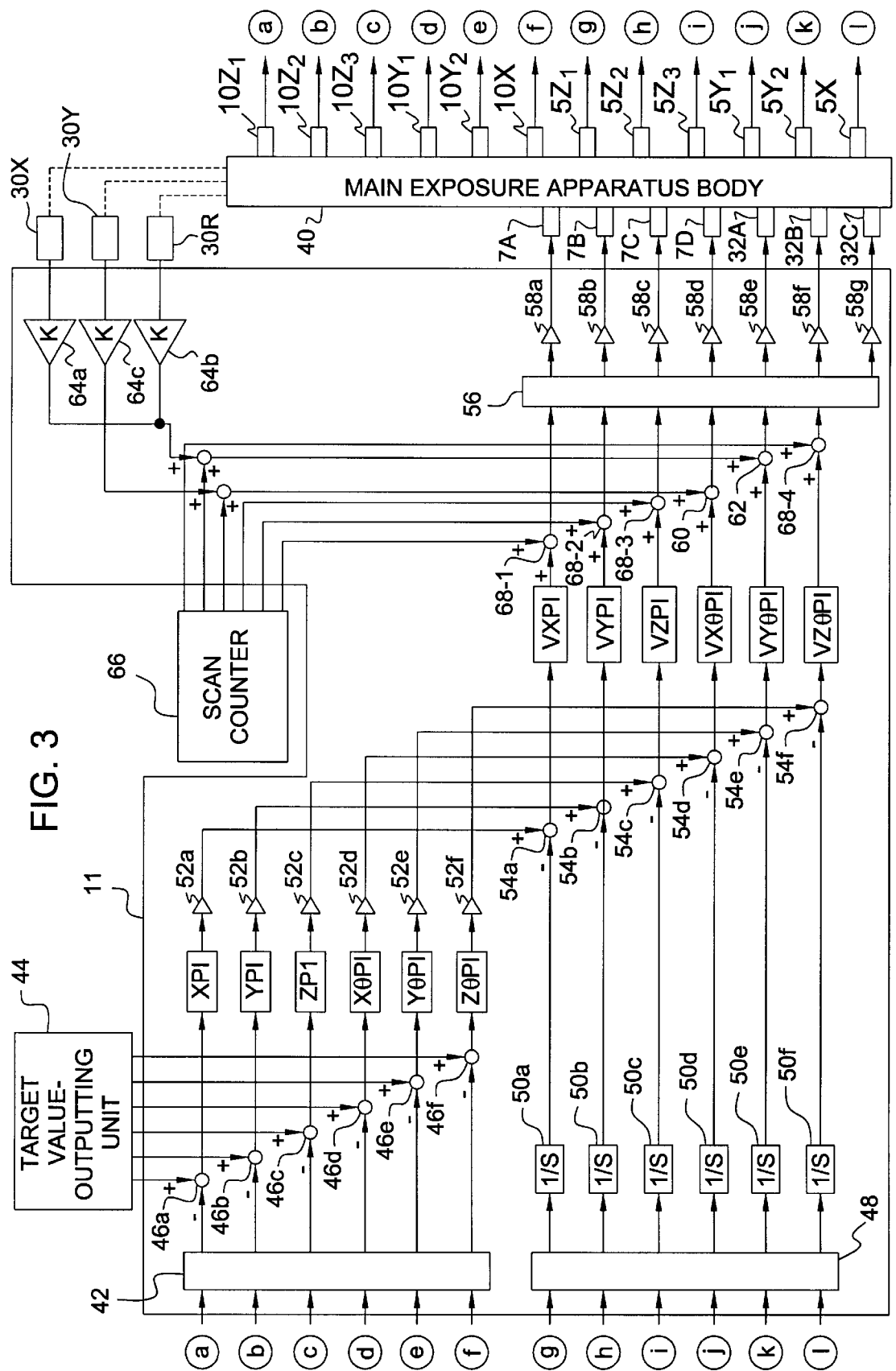
FIG. 3 shows a control block diagram illustrating an arrangement of a first embodiment of a control system for actuators.

Next, a first embodiment of the control system for the actuators 7A to 7D, 32A to 32C for preventing the main exposure apparatus body 40 from vibration will be explained with reference to a block diagram in FIG. 3, principally referring to a control unit 11.

First Embodiment of Control System

The control unit 11 comprises a vibration control system for driving and controlling the actuators 7A, 7B, 7C, 7D, 32A, 32B, 32C so that vibration of the main exposure apparatus body 40 including the platform 6 is suppressed on the basis of the outputs of the displacement sensors $10Z_1$, $10Z_2$, $10Z_3$, $10Y_1$, $10Y_2$, 10X and the acceleration sensors $5Z_1$, $5Z_2$, $5Z_3$, $5Y_1$, $5Y_2$, 5X, and a vibration-compensating system for forecasting the amount of inclination of the platform 6 caused by movement of the position of the center of gravity during movement of the XY stage 20 and the reticle stage 27, for example, during scanning of the XY stage 20 and the reticle stage 27 for scanning exposure on the basis of the outputs of the interferometers 30X, 30Y, 30R, and inputting command values to correct the amount of inclination into the vibration control system in a feedforward manner.

The first embodiment will be explained in further detail below. Namely, the vibration control system comprises the following components. A first coordinate-converting unit 42 is provided for inputting the outputs of the displacement sensors $10Z_1$, $10Z_2$, $10Z_3$, $10Y_1$, $10Y_2$, 10X through unillustrated A/D converters respectively, and converting them into displacement amounts (x, y, z, $\theta_x$, $\theta_y$, $\theta_z$) in directions of six degrees of freedom (X, Y, Z, Xθ, Yθ, Zθ, see FIG. 1) of the center of gravity G of the main exposure apparatus body 40. Six subtracters 46a to 46f are provided for subtracting the displacement amounts (x, y, z, $\theta_x$, $\theta_y$, $\theta_z$) in the directions of the six degrees of freedom of the center of gravity G after the conversion by the first coordinate-converting unit 42 from target values ($x_0$, $y_0$, $z_0$, $\theta_{x0}$, $\theta_{y0}$, $\theta_{z0}$) of the position of the center of gravity in the directions of the six degrees of freedom inputted from a target value-outputting unit 44 respectively, and calculating positional deviations ($\Delta x = \theta_0 - x$, $\Delta y = y_0 - y$, $\Delta z = z_0 - z$, $\Delta \theta_x = \theta_{x0} - \theta_x$, $\Delta \theta_y = \theta_{y0} - \theta_y$, $\Delta \theta_z = \theta_{x0} - \theta_z$) in the respective directions of the six degrees of freedom respectively. Position controllers XPI, YPI, ZPI, XθPI, YθPI, ZθPI in the respective directions of the six degrees of freedom composed of PI controllers are provided for performing control operations by using operation signals of the positional deviations $\Delta x$, $\Delta y$, $\Delta z$, $\Delta \theta_x$, $\Delta \theta_y$, $\Delta \theta_z$ in the respective directions of the six degrees of freedom. A second coordinate-converting unit 48 is provided for inputting the outputs of the acceleration sensors $5Z_1$, $5Z_2$, $5Z_3$, $5Y_1$, $5Y_2$, 5X through unillustrated A/D converters respectively, and converting them into accelerations (x", y", z", $\theta_x"$, $\theta_y"$, $\theta_z"$) in the directions of the six degrees of freedom of the center of gravity G. Six integrators 50a to 50f are provided for integrating the accelerations x", y", z", $\theta_x"$, $\theta_y"$, $\theta_z"$ in the directions of the six degrees of freedom of the center of gravity G after the conversion by the second coordinate-converting unit 48 respectively, and converting them into velocities x', y', z', $\theta_x'$, $\theta_y'$, $\theta_z'$ of the center of gravity G in the respective directions. Velocity-converting gains 52a to 52f are provided for converting outputs of the position controllers XPI, YPI, ZPI, XθPI, YθPI, ZθPI into velocity command values $x_0'$, $y_0'$, $z_0'$, $\theta_{x0}'$, $\theta_{y0}'$, $\theta_{z0}'$ respectively. Six subtracters 54a to 54f are provided for subtracting the outputs x', y', z', $\theta_x'$, $\theta_y'$, $\theta_z'$ of the integrators 50a to 50f from the velocity command values $x_0'$, $y_0'$, $z_0'$, $\theta_{x0}'$, $\theta_{y0}'$, $\theta_{z0}'$ after the conversion respectively, and calculating velocity deviations ($\Delta x' = x_0' - x'$, $\Delta y' = y_0' - y'$, $\Delta z' = z_0' - z'$, $\Delta \theta_x' = \theta_{x0}' - \theta_x'$, $\Delta \theta_y' = \theta_{y0}' - \theta_y'$, $\Delta \theta_z' = \theta_{z0}' - \theta_z'$) in the respective directions of the six degrees of freedom. Velocity controllers VXPI, VYPI, VZPI, VXθPI, VYθPI, VZθPI in the respective directions of the six degrees of freedom composed of PI controllers are provided for performing control operations by using operation signals of the velocity deviations $\Delta x'$, $\Delta y'$, $\Delta z'$, $\Delta \theta_x'$, $\Delta \theta_y'$, $\Delta \theta_z'$ in the respective directions of the six degrees of freedom. A non-interfering calculating unit 56 is provided for performing non-interfering calculation for converting the velocity control amounts in the respective directions of the six degrees of freedom calculated by the controllers into velocity command values to be generated at the positions of the respective actuators. Thrust gains 58a to 58g are provided for converting the velocity command values to be generated at the positions of the respective actuators after the conversion by the non-interfering calculating unit 56 into thrust forces to be generated in the respective actuators.

Namely, the vibration control system of the first embodiment is provided as a multiple loop control system comprising a velocity control loop constructed as an internal loop including the acceleration sensors, the integrators, and the velocity controllers, the velocity control loop being arranged at the inside of a position control loop constructed by including the displacement sensors and the position controllers.

The vibration-compensating system comprises adders 60, 62 provided on output lines of the velocity controller VXθPI for the Xθ direction and the velocity controller VYθPI for the Yθ direction respectively, amplifiers 64a, 64b for multiplying measured values obtained by the laser interferometers 30X, 30R by K and outputting obtained results to the adder 62, and an amplifier 64c for multiplying an output of the laser interferometer 30Y by K and outputting an obtained result to the adder 60. Now the significance of the gain K of the amplifier 64a will be briefly explained. For example, when the XY stage 20 is moved in the X axis direction by a distance x, then the center of gravity of the main exposure apparatus body 40 including the platform 6 is deviated from its initial position, and the platform 6 is inclined about the Y axis by θ=ax. The coefficient a is determined by the spring rigidity of the vibration-preventive pads. Accordingly, the coefficient a is determined beforehand, and the gain K is set so that the control amount for correcting the inclination θ=ax is Kx. Therefore, when the position x of the XY stage 20 in the X axis direction, which is the measured value obtained by the laser interferometer 30X for the X axis, is multiplied by K by the amplifier 64a, and the obtained result is inputted (feedforward-inputted) into the adder 62, then the adder 62 calculates the control amount of the velocity in the Yθ direction for correcting the inclination of the platform 6 about the Y axis while taking the inclination θ into consideration, and the obtained result is inputted into the non-interfering calculating unit 56. On the other hand, the reticle stage 27 is moved in the X axis direction during scanning, and hence the position of the center of gravity of the main exposure apparatus body 40 including the platform 6 is moved, consequently giving rise to a cause for the platform 6 to be inclined about the Y axis. Accordingly, the position x of the reticle stage 27, which is the measured value obtained by the laser interferometer 30R for the reticle stage, is multiplied by K by the amplifier 64b, and an obtained result is added to the output of the amplifier 64a. After that, an obtained result is added to the output of the scan counter 66 described later on, followed by being inputted into the adder 62. The reticle stage 27 and the XY stage 20 are synchronously moved during scanning exposure in directions opposite to one another along the X axis direction. However, they have different weights and different velocities from each other, and hence the inclination of the platform 6 arises. When the XY stage 20 is scanned and driven along the X axis direction, the output of the laser interferometer 30Y scarcely suffers fluctuation. Accordingly, it is usually unnecessary for the amplifier 64c to consider the variation in the position of the center of gravity in the Y direction. However, in some cases, the position of the center of gravity of the XY stage 20 in the X axis direction may be inconsistent with the position of the center of gravity of the main exposure apparatus body 40 in the X axis direction due to some structural reason. In such a case, when the XY stage 20 is scanned and driven along the X axis direction, the output of the laser interferometer 30Y fluctuates. In addition, upon stepping in the Y axis direction, the output of the laser interferometer 30Y also fluctuates. The inclination of the platform 6 based on the output as mentioned above is processed by the control unit 11 in the same manner as described above so that the inclination amount of the platform 6 about the X axis is calculated, and the gain K of the amplifier 64c is set (in this case, K is different from the gain K used in the amplifier 64a). The output from the amplifier 64c is added to the output of the scan counter 66 described later on. After that, an obtained result is added to the output of the velocity controller VXθPI by an adder 68-3.

The laser interferometers 30X, 30Y, 30R used in this embodiment are of the type in which counted values obtained by unillustrated counters are outputted as positional information. Therefore, the outputs of the laser interferometers 30X, 30Y, 30R do not represent absolute coordinate positions, but they represent displacements from stop positions of the respective stages.

In this embodiment, the output of the scan counter 66 is feedforward-inputted into the vibration control system through the adders 60, 62, 68-1, 68-2, 68-3, 68-4 provided on output lines of the velocity controllers VXPI to VZθPI for the respective axes. In the exposure apparatus 100 of this embodiment, when shots on the wafer W are exposed, the reticle stage 27 and the XY stage 20 are synchronously scanned in the directions opposite to one another in the scanning directions, i.e., in the X axis directions. During this operation, the reticle stage 27 is moved once for each one shot from an end to an end in a movable range of the reticle stage 27 at a velocity determined by multiplying the velocity of the XY stage 20 by a reciprocal number of a reduction magnification of the projection optical system PL (for example, 4 times or 5 times the velocity of the XY stage 20). Moreover, exposure is performed only in a constant velocity region. Accordingly, the reticle stage 27 undergoes transition of three states of (1) acceleration from a stop state to a target velocity, (2) maintenance of the target velocity, and (3) deceleration from the target velocity to the stop state. Therefore, a large reaction force acts on the platform 6 through the second column 26 immediately after the start (1) and immediately before the stop (3) of movement of the stage 27, and vibration arises in the main exposure apparatus body 40 including the platform 6. Vibration also arises in the main exposure apparatus body 40 on account of movement of the XY stage 20. Thus the scan counter 66 is operated, and command values corresponding to reaction forces in directions opposite to those of the accelerations of the XY stage 20 and the reticle stage 27 are feedforward-inputted into the vibration control system so that the vibration immediately after the start and immediately before the stop of movement of the stage 27 is suppressed. The command values corresponding to the reaction forces in the directions opposite to those of the accelerations are not limited to the command values for the X axis direction. The command values to be inputted also include command values for the $\theta_y$ and $\theta_z$ directions generated by the movement of the stages 20, 27. Upon stepping of the stage 20 in the Y axis direction, the scan counter 66 is operated to input a command value in the Y axis direction and a command value in the $\theta_x$ direction into the vibration control system.

According to the exposure apparatus of this embodiment constructed as described above, for example, when the XY stage 20 and the reticle stage 27 are scanned along the X axis direction during scanning exposure, the control unit 11 drives and controls the actuators 7A to 7D so as to correct the inclination of the platform 6 corresponding to the displacement amounts of the respective stages measured by the laser interferometers 30X, 30R. Moreover, the command value for the correction amount of the inclination is inputted in a feedforward manner. Accordingly, it is possible to actually prevent the platform 6 from being inclined. Therefore, the vibration of the main exposure apparatus body 40 including the platform 6 is effectively suppressed without being affected by the movement of the center of gravity of the main exposure apparatus body 40 caused by the movement of the stages 20, 27 by driving and controlling the actuators 7A, 7B, 7C, 7D, 32A, 32B, 32C by the control unit 11 on the basis of the outputs of the displacement sensors $10Z_1$, $10Z_2$, $10Z_3$, $10Y_1$, $10Y_2$, 10X, and the acceleration sensors $5Z_1$, $5Z_2$, $5Z_3$, $5Y_1$, $5Y_2$, 5X. Further, the vibration immediately after the start and immediately before the stop of movement of the XY stage 20 and the reticle stage 27 during scanning exposure is also suppressed by the feedforward input of the command value from the scan counter 66.

As explained above, according to this embodiment, the actuators 7A to 7D can be controlled in a feedforward manner so as to suppress the inclination of the platform 6 resulting from the movement of the center of gravity of the main exposure apparatus body 40 caused by the movement of the XY stage 20 and the reticle stage 27 without raising the gain of the position control loop. Accordingly, it is possible to avoid the inconvenience that the floor vibration is transmitted to the main apparatus body. Therefore, it is possible to improve the suppressing (vibration-damping) effect on disturbance vibration without deteriorating the vibration-preventive performance without being affected by the movement of the position of the center of gravity of the main exposure apparatus body associated with the movement of the stages.

The resolvent principle of the present invention, which resides in that the inclination of the vibration-preventive pedestal caused by the movement of the center of gravity of the main exposure apparatus body (main apparatus body) associated with the movement of the stages is forecasted, and the actuators are feedforward-controlled so that the influence of the inclination is offset by using the command values to correct the inclination, is applied to not only the case to prevent the main apparatus body 6 from swinging in the directions of the six degrees of freedom. For example, when the stage is arranged so that it moves over the position of the center of gravity of the main apparatus body, the main apparatus body not necessarily moves in the directions of the six degrees of freedom even in the case of movement of the stage. However, it is clear that the resolvent principle of the present invention effectively functions even in such a case. In this context, the numbers of the displacement sensors and the acceleration sensors (vibration sensors) are not limited to six.

Second Embodiment of Control System

Figure 4:
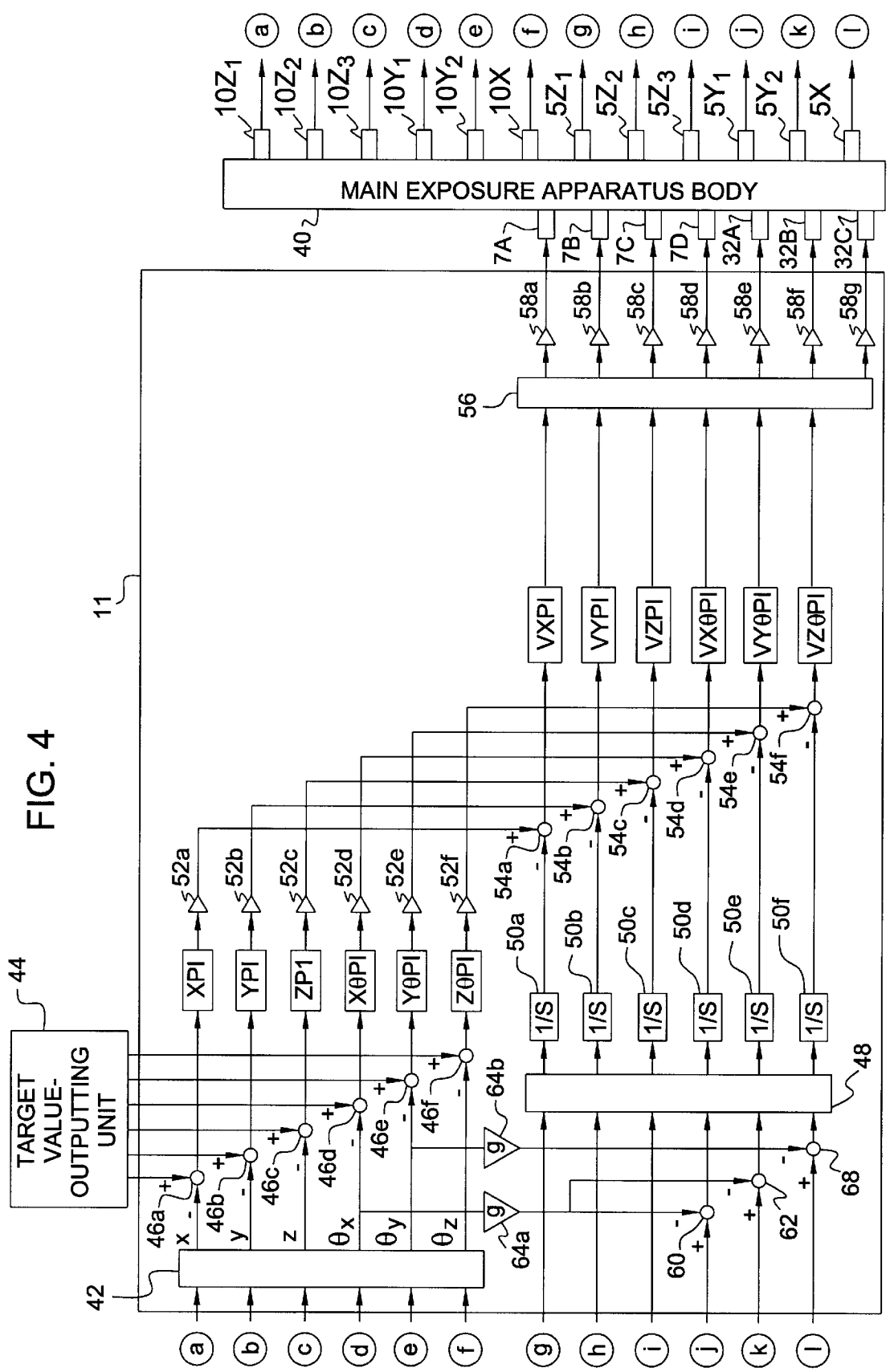
FIG. 4 shows a control block diagram illustrating an arrangement of a second embodiment of the control system for actuators.

Next, another control system for the actuators 7A to 7D, 32A to 32C, provided for preventing the main exposure apparatus body 40 from vibration, will be explained on the basis of the block diagram shown in FIG. 4, principally referring to a control unit 11.

The control unit 11 comprises a vibration control system for driving and controlling the actuators 7A, 7B, 7C, 7D, 32A, 32B, 32C so that vibration of the main exposure apparatus body 40 including the platform 6 is suppressed on the basis of outputs of the displacement sensors $10Z_1$, $10Z_2$, $10Z_3$, $10Y_1$, $10Y_2$, 10X and the acceleration sensors $5Z_1$, $5Z_2$, $5Z_3$, $5Y_1$, $5Y_2$, 5X, and a vibration-compensating system for removing gravitational acceleration components contained in detected values obtained by the acceleration sensors $5Y_1$, $5Y_2$, 5X as horizontal acceleration sensors on the basis of displacement in a direction of inclination with respect to the horizontal plane obtained on the basis of the outputs of the three displacement sensors $10Z_1$, $10Z_2$, $10Z_3$ for detecting displacement in the Z direction.

The vibration control system comprises, in the same manner as the vibration control system of the first embodiment explained with reference to FIG. 3, a first coordinate-converting unit 42, six subtracters 46a to 46f, position controllers XPI, YPI, ZPI, XθPI, YθPI, ZθPI, a second coordinate-converting unit 48, six integrators 50a to 50f, velocity-converting gains 52a to 52f, six subtracters 54a to 54f, velocity controllers VXPI, VYPI, VZPI, VXθPI, VYθPI, VZθPI, and thrust gains 58a to 58g.

Namely, the vibration control system of this embodiment is provided as a multiple loop control system comprising a velocity control loop constructed as an internal loop including the acceleration sensors, the integrators, and the velocity controllers, the velocity control loop being arranged at the inside of a position control loop constructed by including the displacement sensors and the position controllers.

Figure 5:
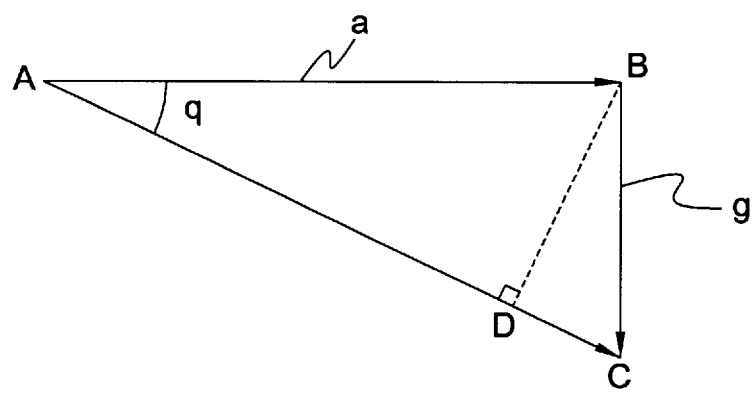
FIG. 5 illustrates a principle of removal of an influence exerted by a gravitational acceleration component contained in a detected value obtained by a horizontal acceleration sensor in the second embodiment.

The vibration-compensating system comprises subtracters 60, 62, 68 provided on input lines of the second coordinate-converting unit 48 respectively, an amplifier 64a having a gain g provided between subtracters 60, 62 and an output line of an inclination component about the X axis (i.e., inclination component in the Y direction) $θ_x$ outputted from the first coordinate-converting unit 42, and an amplifier 64b having a gain g provided between a subtracter 68 and an output line of an inclination component about the Y axis (i.e., inclination component in the X direction) $θ_y$ outputted from the first coordinate-converting unit 42. According to this arrangement, the subtracter 60 calculates a difference between the output of the acceleration sensor $5Y_1$ and $gθ_x$ which is an output of the amplifier 64a, and the difference is outputted to the second coordinate-converting unit 48. Now the significance of this arrangement will be briefly explained with reference to FIG. 5.

It is assumed that an original acceleration to be detected by the acceleration sensor $5Y_1$ is represented by a (arrow AB). When the platform 6 is inclined by an angle θ about the X axis, the acceleration sensor $5Y_1$ detects an acceleration indicated by an arrow AC to which a gravitational acceleration component g (arrow BC) is added. Accordingly, the acceleration sensor $5Y_1$ detects the acceleration which is larger than the original acceleration a by g·sinθ indicated by a line segment DC. It is herein approved that θ is usually a minute angle. Accordingly, it is allowable to consider AD=AB=a, and DC=gθ. Therefore, the acceleration to be originally detected, i.e., the acceleration a from which the influence of the gravitational acceleration component g is removed, is inputted into the second coordinate-converting unit 48 as the detected value obtained by the acceleration sensor $5Y_1$ by subtracting gθ from the output of the acceleration sensor $5Y_1$.

Thus the subtracter 60 calculates the difference between the output of the acceleration sensor $5Y_1$ and $g·θ_x$ which is the output of the amplifier 64a so that the difference is outputted to the second coordinate-converting unit 48. It is noted that $\theta_x$ represents the inclination about the X axis (inclination in the Y direction), which corresponds to $\theta$ in FIG. 5.

Based on the same significance, the subtracter 62 calculates a difference between the output of the acceleration sensor $5Y_2$ and $g \cdot \theta_x$ which is the output of the amplifier 64a, the subtracter 68 calculates a difference between the output of the acceleration sensor 5X and $g \cdot \theta_y$ which is an output of the amplifier 64b, and the differences are outputted to the second coordinate-converting unit 48. It is noted that $\theta_y$ represents the inclination about the Y axis (inclination in the X direction).

According to the exposure apparatus 100 of this embodiment constructed as described above, for example, when the XY stage 20 and the reticle stage 27 are scanned along the X axis direction during scanning exposure, and the main exposure apparatus body 40 vibrates due to the movement of the stages, then the actuators 7A, 7B, 7C, 7D, 32A, 32B, 32C are driven and controlled by the vibration control system of the control unit 11 on the basis of the outputs of the displacement sensors $10Z_1$, $10Z_2$, $10Z_3$, $10Y_1$, $10Y_2$, 10X and the acceleration sensors $5Z_1$, $5Z_2$, $5Z_3$, $5Y_1$, $5Y_2$, 5X, and the vibration of the main exposure apparatus body 40 is effectively suppressed. In this situation, when the platform 6 is inclined with respect to the horizontal plane, then the angle of inclination (angle of inclination in the Y direction) $\theta_x$ about the X axis at that time supplied from the first coordinate-converting unit 42 is multiplied by g by the amplifier 64a, and the gravitational acceleration component $g \cdot \theta_x$ is inputted into the subtracters 60, 62 respectively. The subtracters 60, 62 subtract the gravitational acceleration component $g \cdot \theta_x$ from the detected values obtained by the acceleration sensors $5Y_1$, $5Y_2$ respectively, and obtained results are outputted to the second coordinate-converting unit 48. Similarly, the angle of inclination (angle of inclination in the X direction) $\theta_y$ about the Y axis at that time supplied from the first coordinate-converting unit 42 is multiplied by g by the amplifier 64b, and the gravitational acceleration component $g \cdot \theta_y$ is inputted into the subtracter 68. The subtracter 68 subtracts the gravitational acceleration component $g \cdot \theta_y$ from the detected value obtained by the acceleration sensor 5X, and an obtained result is outputted to the second coordinate-converting unit 48. Accordingly, the second coordinate-converting unit 48 performs conversion into the velocity of the center of gravity G on the basis of the detected values obtained by the acceleration sensors $5Y_1$, $5Y_2$, 5X from which the gravitational acceleration component due to the inclination of the platform 6 has been removed. Consequently, the actuators are driven by proper command values without being affected by the gravitational acceleration components contained in the detected values obtained by the horizontal acceleration sensors resulting from the inclination of the platform 6.

As explained above, according to this embodiment, it is possible to improve the suppressing (vibration-damping) effect on disturbance vibration without being affected by the inclination of the platform 6. In this embodiment, the influence of the inclination of the main exposure apparatus body 40 can be removed without raising the gain of the position control loop. Accordingly, it is possible to avoid the inconvenience that the floor vibration is transmitted to the main apparatus body. Therefore, the vibration-preventive performance is not deteriorated.

It is sufficient for detecting the inclination components ($\theta_x$, $\theta_y$) with respect to the horizontal plane to provide three displacement sensors for detecting displacement in the Z direction. Accordingly, it is not necessarily indispensable to provide all of the displacement sensors $10Y_1$, $10Y_2$, 10X. The resolvent principle of the present invention, which resides in that the inclination of the vibration-preventive pedestal is detected, and the obtained result is used to remove the influence of the gravitational acceleration component contained in the detected value obtained by the horizontal acceleration sensor in order to drive and control the actuators, is applied to not only the case to prevent the main apparatus body from swinging in the directions of the six degrees of freedom. For example, when the stage is arranged so that it moves over the position of the center of gravity of the main apparatus body, the main apparatus body not necessarily moves in the directions of the six degrees of freedom even in the case of movement of the stage. However, it is clear that the resolvent principle of the present invention effectively functions even in such a case.

The vibration-compensating system used in the first embodiment of the control system may be incorporated into the vibration-compensating system referred to in the second embodiment of the control system. By doing so, it is possible to suppress the inclination and the vibration of the vibration-preventive pedestal caused by the movement of the stages in the exposure apparatus.

The foregoing embodiments have been exemplified by the arrangement in which the vibration-preventive apparatus according to the present invention is applied to the projection exposure apparatus of the scanning exposure type based on the step-and-scan system. However, the vibration-preventive apparatus of the present invention can be preferably applied to a projection exposure apparatus based on the stepper system because the stage moves on the platform. The projection exposure apparatus based on the stepper system is of the full-wafer exposure type. Accordingly, the scan counter is unnecessary because the stage is stationary during exposure.

The foregoing embodiments have been exemplified by the arrangement in which swinging of the main exposure apparatus body in the directions of the six degrees of freedom is suppressed by using the seven actuators. However, the present invention is not limited thereto. It is sufficient that the inclination of the platform (vibration-preventive pedestal) can be corrected. Accordingly, it is sufficient to provide at least three actuators in the Z direction to be used as the actuators.

As explained above, according to the vibration-preventive apparatus in accordance with the first aspect of the present invention and the exposure apparatus in accordance with the second aspect of the present invention, an excellent effect, which has not been hitherto achieved, is obtained in that it is possible to improve the suppressing (vibration-damping) effect on disturbance vibration without deteriorating the vibration-preventive effect without being affected by the movement of the position of the center of gravity of the main apparatus body associated with the movement of the stages. Especially, when the scan counter is provided, then the actuators are controlled by the vibration control system in accordance with the command values feedforward-inputted from the scan counter, and the vibration generated on the vibration-preventive pedestal immediately after the start and immediately before the stop of the movement of the stage is suppressed. Accordingly, it is possible to further improve the vibration-damping effect.

According to the vibration-preventive apparatus in accordance with the third aspect of the present invention and the exposure apparatus in accordance with the fourth aspect of the present invention, an excellent effect, which has not been hitherto achieved, is obtained in that it is possible to improve the suppressing (vibration-damping) effect on disturbance vibration without being affected by the inclination of the vibration-preventive pedestal.

The present invention may be practiced or embodied in other various forms without departing from the spirit or essential characteristics thereof. It will be understood that the scope of the present invention is indicated by the appended claims, and all variations and modifications concerning, for example, the presence or absence of the scan counter, the numbers of the displacement sensors and the acceleration sensors, the type of the projection exposure apparatus, and the number of the actuators, which come within the equivalent range of the claims, are embraced in the scope of the present invention.

What is claimed is:

1. A vibration-preventive apparatus comprising:
    a vibration-preventive pedestal held horizontally through at least three vibration-preventive pads;
    at least one stage movable on the vibration-preventive pedestal;
    at least three actuators for moving the vibration-preventive pedestal in a vertical direction;
    at least one displacement sensor for detecting displacement of the vibration-preventive pedestal;
    at least one vibration sensor for detecting vibration of the vibration-preventive pedestal;
    a vibration control system for controlling the respective actuators on the basis of outputs of the displacement sensor and the vibration sensor so that the vibration of the vibration-preventive pedestal is suppressed;
    a position-measuring unit for measuring a position of the at least one stage; and
    a vibration-compensating system for forecasting an amount of inclination of the vibration-preventive pedestal caused by movement of a position of a center of gravity during movement of the stage on the basis of an output of the position-measuring unit, and inputting a command value to correct the amount of inclination into the vibration control system in a feedforward manner.

2. The vibration-preventive apparatus according to claim 1, further comprising a scan counter for feedforward-inputting, into the vibration control system, command values for reaction forces having directions opposite to those of accelerations immediately after start and immediately before stop of the movement of the stage.

3. The vibration-preventive apparatus according to claim 1, wherein the vibration control system comprises:
    a first coordinate-converting unit for converting the output of the displacement sensor into displacements in directions of degrees of freedom of the center of gravity of the vibration-preventive pedestal;
    a first velocity converting unit for determining velocity command values obtained on the basis of differences between outputs from the first coordinate-converting unit and target values of the position of the center of gravity of the vibration-preventive pedestal;
    a second coordinate-converting unit for converting the output of the vibration sensor into accelerations for each of the degrees of freedom of the center of gravity of the vibration-preventive pedestal;
    a second velocity converting unit for determining velocities of the center of gravity of the vibration-preventive pedestal from the accelerations of the second coordinate-converting unit;
    subtracters for determining velocity deviations for each of the degrees of freedom of the center of gravity of the vibration-preventive pedestal from the velocities and the velocity command values; and
    velocity controllers for generating, from outputs of the subtracters, velocity control amounts of the center of gravity of the vibration-preventive pedestal for each of the degrees of freedom; and
    wherein the vibration-compensating system feedforward-inputs command values to correct the amount of inclination obtained from the output of the position-measuring unit.

4. The vibration-preventive apparatus according to claim 1, further comprising at least one actuator for moving the vibration-preventive pedestal in X and Y directions perpendicular to the vertical direction respectively.

5. In an exposure apparatus that forms a pattern onto a photosensitive substrate by projecting illuminating light through a projection optical system, a vibration control apparatus comprising:
    a vibration-preventive pedestal held horizontally through at least three vibration-preventive pads;
    a substrate stage, movable on the vibration-preventive pedestal, for holding the photosensitive substrate;
    at least three actuators for moving the vibration-preventive pedestal in a vertical direction;
    at least one displacement sensor for detecting displacement of the vibration-preventive pedestal;
    at least one vibration sensor for detecting vibration of the vibration-preventive pedestal;
    a vibration control system for controlling the respective actuators on the basis of outputs of the displacement sensor and the vibration sensor so that the vibration of the vibration-preventive pedestal is suppressed;
    a position-measuring unit for measuring a position of the substrate stage; and
    a vibration-compensating system for forecasting an amount of inclination of the vibration-preventive pedestal caused by movement of a position of a center of gravity during movement of the substrate stage on the basis of an output of the position-measuring unit, and inputting a command value to correct the amount of inclination into the vibration control system in a feedforward manner.

6. The exposure apparatus according to claim 5, further comprising a scan counter for feedforward-inputting, into the vibration control system, command values for reaction forces having directions opposite to those of accelerations immediately after start and immediately before stop of the movement of the substrate stage.

7. The exposure apparatus according to claim 5, further comprising a mask stage movable in synchronization with the substrate stage, and a position-measuring unit for measuring a position of the mask stage, wherein the vibration-compensating system forecasts an amount of inclination of the vibration-preventive pedestal caused by movement of a position of a center of gravity during movement of the substrate stage and the mask stage on the basis of outputs of the position-measuring units for the respective stages, and inputs a command value to correct the amount of inclination into the vibration control system in a feedforward manner.

8. The exposure apparatus according to claim 7, further comprising a scan counter for feedforward-inputting, into the vibration control system, command values for reaction forces having directions opposite to those of accelerations immediately after start and immediately before stop of the movement of the substrate stage and the mask stage.

9. The exposure apparatus according to claim 5, wherein the vibration control system comprises:

a first coordinate-converting unit for converting the output of the displacement sensor into displacements in directions of degrees of freedom of the center of gravity of the vibration-preventive pedestal;

a first velocity converting unit for determining velocity command values obtained on the basis of differences between outputs from the first coordinate-converting unit and target values of the position of the center of gravity of the vibration-preventive pedestal;

a second coordinate-converting unit for converting the output of the vibration sensor into accelerations for each of the degrees of freedom of the center of gravity of the vibration-preventive pedestal;

a second velocity converting unit for determining velocities of the center of gravity of the vibration-preventive pedestal from the accelerations of the second coordinate-converting unit;

subtracters for determining velocity deviations for each of the degrees of freedom of the center of gravity of the vibration-preventive pedestal from the velocities and the velocity command values; and velocity controllers for generating, from outputs of the subtracters, velocity control amounts of the center of gravity of the vibration-preventive pedestal for each of the degrees of freedom; and wherein the vibration-compensating system feedforward-inputs command values to correct the amount of inclination obtained from the output of the position-measuring unit.

10. A vibration-preventive apparatus comprising:

a vibration-preventive pedestal held horizontally through at least three vibration-preventive pads;

at least three actuators for driving the vibration-preventive pedestal in a vertical direction at different positions;

at least three vertical displacement sensors for detecting vertical displacement of the vibration-preventive pedestal at different points;

a vibration sensor for detecting at least an acceleration of the vibration-preventive pedestal in a horizontal plane;

a vibration control system for controlling the respective actuators on the basis of outputs of the displacement sensors and the vibration sensor so that vibration of the vibration-preventive pedestal is suppressed; and a vibration-compensating system for removing a gravitational acceleration component contained in a detected value obtained by the vibration sensor on the basis of displacement in a direction of inclination with respect to the horizontal plane obtained on the basis of the outputs of the three vertical displacement sensors.

11. The vibration-preventive apparatus according to claim 10, wherein the vibration sensor comprises an acceleration sensor for an X direction and an acceleration sensor for a Y direction, and wherein the vibration control system comprises:

a first coordinate-converting unit for converting the output of the displacement sensor into displacements in directions of degrees of freedom of the center of gravity of the vibration-preventive pedestal;

a first velocity converting unit for determining velocity command values obtained on the basis of differences between outputs from the first coordinate-converting unit and target values of the position of the center of gravity of the vibration-preventive pedestal;

a second coordinate-converting unit for converting the output of the vibration sensor into accelerations for each of the degrees of freedom of the center of gravity of the vibration-preventive pedestal;

a second velocity converting unit for determining velocities of the center of gravity of the vibration-preventive pedestal from the accelerations of the second coordinate-converting unit;

subtracters for determining velocity deviations for each of the degrees of freedom of the center of gravity of the vibration-preventive pedestal from velocities of the center of gravity obtained from the second velocity converting unit;

velocity controllers for generating, from outputs of the subtracters, velocity control amounts of the center of gravity of the vibration-preventive pedestal for each of the degrees of freedom; and wherein the vibration-compensating system comprises respective amplifiers for multiplying, by a gravitational acceleration, an output of an inclination component $\theta_x$ about an X axis and an output of an inclination component $\theta_y$ about a Y axis outputted from the first coordinate-converting unit, and subtracters for determining the differences between outputs from the respective amplifiers and outputs of the acceleration sensors for the X and Y directions so that outputs of the subtracters are outputted to the second coordinate-converting unit.

12. The vibration-preventive apparatus according to claim 10, further comprising at least one stage movable on the vibration-preventive pedestal.

13. The vibration-preventive apparatus according to claim 10, further comprising at least one actuator for moving the vibration-preventive pedestal in X and Y directions perpendicular to the vertical direction respectively.

14. The vibration-preventive apparatus according to claim 10, further comprising a vibration sensor for detecting an acceleration of the vibration-preventive pedestal in the vertical direction.

15. In an exposure apparatus that forms a pattern onto a photosensitive substrate by projecting illuminating light through a projection optical system, a vibration control apparatus comprising:

a vibration-preventive pedestal held horizontally through at least three vibration-preventive pads;

at least one stage, movable on the vibration-preventive pedestal, for holding the photosensitive substrate;

at least three actuators for driving the vibration-preventive pedestal in a vertical direction at different positions;

at least three vertical displacement sensors for detecting vertical displacement of the vibration-preventive pedestal at different points;

a vibration sensor for detecting at least an acceleration of the vibration-preventive pedestal in a horizontal plane;

a vibration control system for controlling the respective actuators on the basis of outputs of the displacement sensors and the vibration sensor so that vibration of the vibration-preventive pedestal is suppressed; and a vibration-compensating system for removing a gravitational acceleration component contained in a detected value obtained by the vibration sensor on the basis of displacement in a direction of inclination with respect to the horizontal plane obtained on the basis of the outputs of the three vertical displacement sensors.

16. The exposure apparatus according to claim 15, further comprising a position-measuring unit for measuring a position of the at least one stage, wherein the vibration-compensating system further forecasts an amount of inclination of the vibration-preventive pedestal caused by movement of a position of a center of gravity during movement of the at least one stage on the basis of an output of the stage position-measuring unit, and inputs a command value to correct the amount of inclination into the vibration control system in a feedforward manner.

17. The exposure apparatus according to claim 16, provided as a scanning type exposure apparatus, further comprising a mask stage movable in synchronization with the at least one stage as a substrate stage, and a position-measuring unit for the mask stage.

18. The exposure apparatus according to claim 17, further comprising a scan counter for feedforward-inputting, into the vibration control system, command values for reaction forces having directions opposite to those of accelerations immediately after start and immediately before stop of the movement of the substrate stage and the mask stage.

19. The exposure apparatus according to claim 15, wherein the vibration sensor comprises an acceleration sensor for an X direction and an acceleration sensor for a Y direction wherein the vibration control system comprises:
a first coordinate-converting unit for converting the output of the displacement sensor into displacements in directions of degrees of freedom of the center of gravity of the vibration-preventive pedestal;
a first velocity converting unit for determining velocity command values obtained on the basis of differences between outputs from the first coordinate-converting unit and target values of the position of the center of gravity of the vibration-preventive pedestal;
a second coordinate-converting unit for converting the output of the vibration sensor into accelerations for each of the degrees of freedom of the center of gravity of the vibration-preventive pedestal;
a second velocity converting unit for determining velocities of the center of gravity of the vibration-preventive pedestal from the accelerations of the second coordinate-converting unit;
subtracters for determining velocity deviations for each of the degrees of freedom of the center of gravity of the vibration-preventive pedestal from velocities of the center of gravity obtained from the second velocity converting unit;
velocity controllers for generating, from outputs of the subtracters, velocity control amounts of the center of gravity of the vibration-preventive pedestal for each of the degrees of freedom; and
wherein the vibration-compensating system comprises respective amplifiers for multiplying, by a gravitational acceleration, an output of an inclination component $\theta_x$ about an X axis and an output of an inclination component $\theta_y$ about a Y axis outputted from the first coordinate-converting unit, and subtracters for determining the differences between outputs from the respective amplifiers and outputs of the acceleration sensors for the X and Y directions so that outputs of the subtracters are outputted to the second coordinate-converting unit.

20. The exposure apparatus according to claim 15, further comprising at least one actuator for moving the vibration-preventive pedestal in X and Y directions perpendicular to the vertical direction respectively.

21. The exposure apparatus according to claim 15, further comprising a vibration sensor for detecting an acceleration of the vibration-preventive pedestal in the vertical direction.

22. A method of compensating for vibrations in an apparatus having a pedestal, at least one movable stage movable on the pedestal, at least three actuators for vertically moving the pedestal, at least one displacement sensor for detecting displacement of the pedestal and at least one vibration sensor for detecting vibration of the pedestal, the method comprising:
measuring a position of the at least one stage;
forecasting an amount of inclination of the pedestal based on the position of the at least one stage; and
controlling the actuators on the basis of outputs from the displacement sensor, the vibration sensor and the forecast amount of inclination to suppress vibration of the pedestal and to correct the amount of inclination in a feedforward manner.

23. The method of claim 22, wherein controlling the actuators comprises:
converting the output of the displacement sensor into displacements in the directions of degrees of freedom of a center of gravity of the pedestal;
determining velocity command values on the basis of differences between the displacements and target values of the position of the center of gravity of the pedestal;
converting the output of the vibration sensor into accelerations for each of the degrees of freedom of the center of gravity of the pedestal;
determining velocities of the center of gravity of the pedestal from the accelerations;
determining deviations of the center of gravity of the pedestal for each of the degrees of freedom from the velocity command values and the velocities of the center of gravity of the pedestal; and
generating velocity control amounts of the center of gravity for each of the degrees of freedom.

24. A method of compensating for vibrations in an apparatus having a pedestal, at least three actuators for vertically moving the pedestal, at least three vertical displacement sensors for detecting vertical displacement of the pedestal at different points, and at least one vibration sensor for detecting at least an acceleration of the pedestal in a horizontal plane, the method comprising:
removing a gravitational acceleration component contained in a detected value obtained by the vibration sensor based on a direction of inclination of the pedestal with respect to the horizontal plane obtained from the output of the vertical displacement sensors; and
controlling the actuators on the basis of outputs from the displacement sensor and the vibration sensor, with the gravitational acceleration component removed, to suppress vibration of the pedestal.

25. The method of claim 24, wherein removing the gravitational acceleration component comprises:
converting the output of the vibration sensor into accelerations for each of the degrees of freedom of a center of gravity of the pedestal;
multiplying an inclination component about an X axis and an inclination component about a Y axis by a gravitational acceleration; and
determining differences between the multiplied inclinations and the accelerations.

* * * * *